(12) United States Patent
Kato

(10) Patent No.: US 9,643,790 B2
(45) Date of Patent: May 9, 2017

(54) MANUFACTURING WORK MACHINE

(71) Applicant: FUJI MACHINE MFG. CO., LTD., Chiryu (JP)

(72) Inventor: Naohiro Kato, Chiryu (JP)

(73) Assignee: FUJI MACHINE MFG. CO., LTD., Chiryu (JP)

( * ) Notice: Subject to any disclaimer, the term of this patent is extended or adjusted under 35 U.S.C. 154(b) by 0 days.

(21) Appl. No.: 14/916,891

(22) PCT Filed: Sep. 9, 2013

(86) PCT No.: PCT/JP2013/074268
§ 371 (c)(1),
(2) Date: Mar. 4, 2016

(87) PCT Pub. No.: WO2015/033473
PCT Pub. Date: Mar. 12, 2015

(65) Prior Publication Data
US 2016/0200523 A1    Jul. 14, 2016

(51) Int. Cl.
*B65G 21/00* (2006.01)
*B65G 47/24* (2006.01)
(Continued)

(52) U.S. Cl.
CPC .............. *B65G 47/24* (2013.01); *B65G 43/08* (2013.01); *G01C 9/06* (2013.01); *G01C 9/24* (2013.01);
(Continued)

(58) Field of Classification Search
CPC ........ B65G 13/12; B65G 21/06; B65G 21/00; B65G 43/08
(Continued)

(56) References Cited

U.S. PATENT DOCUMENTS 4,194,633 A * 3/1980 Paterson ................... B07B 4/06
198/586
5,100,683 A * 3/1992 Singer ...................... A23B 9/14
118/19
(Continued)

FOREIGN PATENT DOCUMENTS

JP      11-214887 A    8/1999
JP   2005-217081 A    8/2005
(Continued)

OTHER PUBLICATIONS

International Search Report issued Oct. 8, 2013 in PCT/JP2013/074268 filed Sep. 9, 2013.

*Primary Examiner* — James R Bidwell
(74) *Attorney, Agent, or Firm* — Oblon, McClelland, Maier & Neustadt, L.L.P.

(57) ABSTRACT

A board working device includes an adjustment mechanism including a plurality of main legs provided on a bottom portion of a base, the main legs being capable of adjusting a position of the base in vertical directions, and bolt heads for operating the main legs, a mounting head which rotates the bolt heads and adjusts the position of the base in the vertical directions, and a moving device which moves a mounting head to an arbitrary position on the base, in which the bolt heads are arranged within a movement range of the mounting head according to the moving device. Accordingly, it is possible to automatically perform leveling of the base using the mounting head, and it is possible to appropriately and swiftly perform the leveling of the base regardless of proficiency of an individual worker.

6 Claims, 6 Drawing Sheets

(51) Int. Cl.
  *H05K 13/00*  (2006.01)
  *B65G 43/08*  (2006.01)
  *G01C 9/24*  (2006.01)
  *G01C 9/06*  (2006.01)

(52) U.S. Cl.
  CPC ..... *H05K 13/0015* (2013.01); *H05K 13/0061* (2013.01)

(58) Field of Classification Search
  USPC .......................................... 198/860.1, 861.1
  See application file for complete search history.

(56) References Cited

U.S. PATENT DOCUMENTS

| | | | | |
|---|---|---|---|---|
| 5,270,535 | A * | 12/1993 | Leser | G01N 21/90 250/223 B |
| 6,161,811 | A | 12/2000 | Suhara et al. | |
| 6,625,877 | B1 * | 9/2003 | Suhara | F16F 15/022 248/638 |
| 2007/0114113 | A1 * | 5/2007 | Muse | E21B 19/15 198/861.1 |
| 2009/0145556 | A1 * | 6/2009 | Schell | B65G 47/252 156/472 |
| 2014/0124339 | A1 * | 5/2014 | Murphy | B02C 21/026 198/861.1 |

FOREIGN PATENT DOCUMENTS

| | | |
|---|---|---|
| JP | 2005-235835 A | 9/2005 |
| JP | 2006-261500 A | 9/2006 |
| JP | 2012-220444 A | 11/2012 |

\* cited by examiner

MANUFACTURING WORK MACHINE

TECHNICAL FIELD

The present disclosure relates to a manufacturing work machine which is provided with an adjustment mechanism including an adjustment section for adjusting the inclination of one of a base and a conveyance device.

BACKGROUND ART

Leveling of a base of a manufacturing work machine or of a conveyance device arranged on the base is extremely important in order to guarantee the work by the manufacturing work machine. The leveling of the base or the conveyance device (hereinafter, there are cases in which this is described as an "adjustment target body") is work in which the inclination angle of the adjustment target body is set to a predetermined inclination angle, for example, the adjustment target body is set to be level, and, ordinarily, is performed by adjusting the heights of leg sections which support the adjustment target body. In the manufacturing work machine described in the following PTL, a leveling instrument which is arranged on the base is imaged by an imaging device, and the adjustment amounts of the heights of the leg sections are calculated based on imaging data thereof. A worker adjusts the heights of the leg sections to obtain the calculated adjustment amounts.

PTL 1: JP-A-2012-220444

SUMMARY

According to the technique described in the PTL, it is possible to acquire the appropriate adjustment amounts of the heights of the leg sections, and it is possible to reliably perform the leveling of the adjustment target body if it is possible to appropriately adjust the heights of the leg sections to obtain the adjustment amounts. However, the adjustment of the heights of the leg sections largely relies on the proficiency of the individual worker, and depending on the worker, there is a concern that the adjustment of the heights of the leg sections cannot be appropriately performed. There also a concern that a great deal of time will be required for the work. The present disclosure was made in light of these issues, and an object thereof is to provide a manufacturing work machine with which it is possible to appropriately and swiftly perform the leveling of an adjustment target body regardless of the proficiency of the individual worker.

In order to solve the problems described above, there is provided a manufacturing work machine according to an aspect of the disclosure, provided with an adjustment mechanism including an adjustment section for adjusting an inclination of an adjustment target body which is one of a base and a conveyance device which is arranged on the base, the manufacturing work machine including an adjustment section operation device which adjusts the inclination of the adjustment target body by operating the adjustment section, and a moving device which moves the adjustment section operation device to an arbitrary position above the base, in which the adjustment section is arranged within a movement range of the adjustment section operation device according to the moving device.

For the manufacturing work machine according to another aspect, the manufacturing work machine further includes a control device which controls operations of the adjustment section operation device, an inclination checker for confirming the inclination of the adjustment target body, and an imaging device capable of imaging the inclination checker, in which the control device controls the operations of the adjustment section operation device based on imaging data of the inclination checker which is imaged by the imaging device.

For the manufacturing work machine according to another aspect, the manufacturing work machine further includes the conveyance device for conveying a conveyance target object, in which the inclination checker is conveyed together with the conveyance target object by the conveyance device, in which the imaging device images the inclination checker which is conveyed by the conveyance device together with the conveyance target object, and in which the control device controls the operations of the adjustment section operation device based on the imaging data of the inclination checker which is imaged by the imaging device.

For the manufacturing work machine according to another aspect, in the manufacturing work machine, the inclination checker is embedded in the conveyance target object which is conveyed by the conveyance device.

EFFECTS

The manufacturing work machine of the disclosure is provided with the adjustment mechanism including the adjustment section for adjusting the inclination of the adjustment target body, the adjustment section operation device which adjusts the inclination of the adjustment target body by operating the adjustment section, and the moving device which moves the adjustment section operation device to an arbitrary position above the base, in which the adjustment section is arranged within a movement range of the adjustment section operation device according to the moving device. Accordingly, it is possible to automatically perform the leveling of the adjustment target body, and it is possible to appropriately and swiftly perform the leveling of the adjustment target body regardless of the proficiency of an individual worker.

In the work device according another aspect of the disclosure, the leveling instrument is imaged by the imaging device, and the adjustment amounts of the inclination of the adjustment target body are calculated based on the imaging data. The operations of the adjustment section operation device are controlled based on the calculated adjustment amounts. Accordingly, it is possible to reliably perform the leveling of the adjustment target body by the inclination adjustment of the adjustment target body being automatically performed based on the appropriate adjustment amounts.

In the manufacturing work machine according to another aspect, the leveling instrument is conveyed together with the conveyance target object by the conveyance device, and the leveling instrument is imaged by the imaging device. The leveling by the adjustment section operation device is performed using the imaging data. In a manufacturing work machine of the related art, ordinarily, the leveling instrument is arranged on the base and it is necessary to secure the space for arranging the leveling instrument on the base. Therefore, there is a concern that the arrangement space of the leveling instrument will impede efforts to render the manufacturing work machine more compact. However, in the manufacturing work machine according to claim 3, since it is not necessary to provide the leveling instrument on the base, it is possible to render the manufacturing work machine more compact.

In the manufacturing work machine according to another aspect, the leveling instrument is embedded in the conveyance target object. In other words, the leveling instrument is embedded in a member which the conveyance device is capable of conveying. Accordingly, there is no longer shifting between the conveyance target object and the leveling instrument, and it is possible to calculate the appropriate adjustment amounts of the inclination of the adjustment target body.

DESCRIPTION OF EMBODIMENTS

Hereinafter, detailed description will be given of the example of the present disclosure with reference to the drawings as a mode for carrying out the present disclosure.
<Configuration of Board Working Device>

Figure 1:
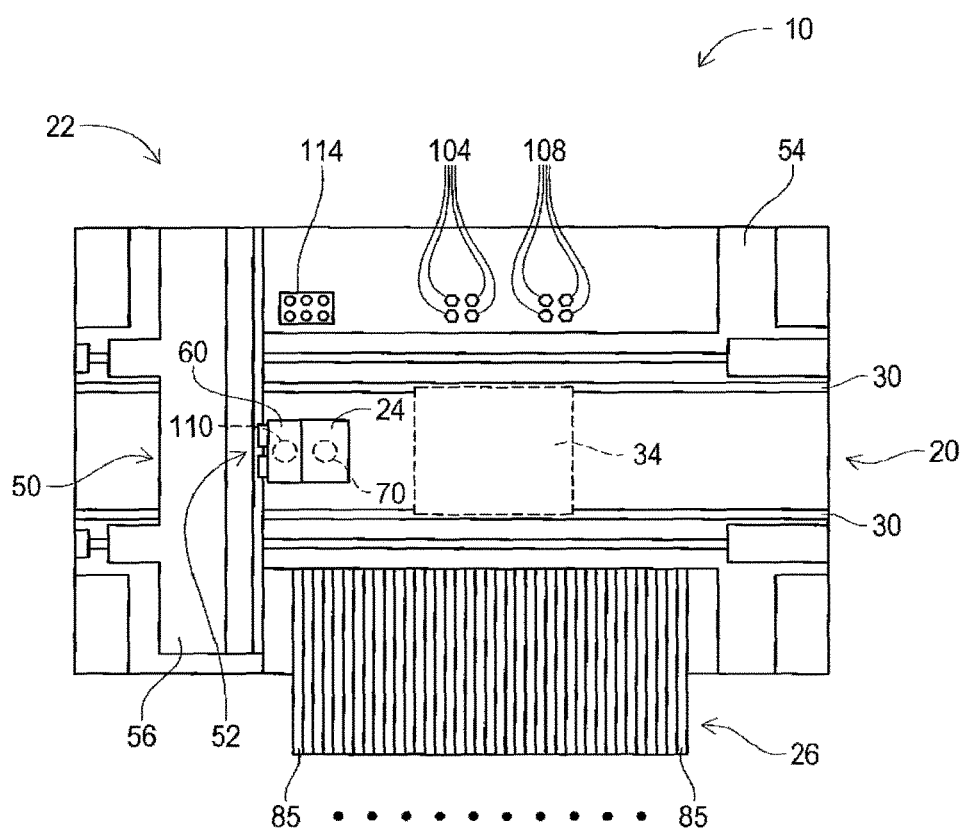
FIG. 1 is a diagram illustrating a board working device which is an example of the present disclosure.
Figure 1:
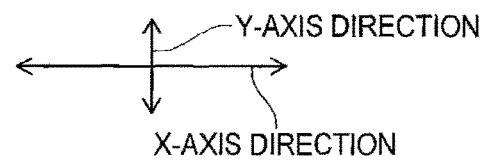

FIG. 1 illustrates a board working device 10 of the example of the present disclosure. The board working device 10 is a device for executing mounting work of electronic components on a circuit board. The board working device 10 is provided with a conveyance device 20, a mounting head moving device (hereinafter, there are cases in which this will be shortened to a "moving device") 22, a mounting head 24, a supply device 26, and an adjustment mechanism (refer to FIG. 3) 28.

The conveyance device 20 includes a pair of conveyor belts 30 which extend in X-axis directions, and an electromagnetic motor (refer to FIG. 5) 32 which causes the conveyor belts 30 to revolve. A circuit board 34 is supported by the pair of conveyor belts 30 and is transported in the X-axis directions by the driving of the electromagnetic motor 32. The conveyance device 20 includes a board holding device (refer to FIG. 5) 36. The board holding device 36 holds the circuit board 34 which is supported by the conveyor belts 30 in a fixed manner in a predetermined position (the position in which the circuit board 34 is depicted in FIG. 1).

The moving device 22 is formed of an X-axis direction slide mechanism 50 and a Y-axis direction slide mechanism 52. The X-axis direction slide mechanism 50 includes an X-axis slider 56 which is provided on a base 54 to be capable of moving in the X-axis directions. The X-axis slider 56 moves to an arbitrary position in the X-axis directions due to the driving of an electromagnetic motor (refer to FIG. 5) 58. The Y-axis direction slide mechanism 52 includes a Y-axis slider 60 which is provided on the side surface of the X-axis slider 56 to be capable of moving in Y-axis directions. The Y-axis slider 60 moves to an arbitrary position in the Y-axis directions due to the driving of an electromagnetic motor (refer to FIG. 5) 62. The mounting head 24 is attached to the Y-axis slider 60. According to this structure, the mounting head 24 moves to an arbitrary position on the base 54 due to the moving device 22.

The mounting head 24 mounts the electronic component on the circuit board. The mounting head 24 includes a suction nozzle 70 which is provided on the bottom end surface of the mounting head 24. The suction nozzle 70 communicates with a positive/negative pressure supply device (refer to FIG. 5) 76 via negative pressure air and positive pressure air paths. The suction nozzle 70 sucks and holds the electronic component using a negative pressure and releases the held electronic component using a positive pressure. The mounting head 24 includes a lifting and lowering device (refer to FIG. 5) 77 which lifts and lowers the suction nozzle 70. The mounting head 24 changes the position of the held electronic component in the vertical directions using the nozzle lifting and lowering device 77. The mounting head 24 includes a turning device (refer to FIG. 5) 78 which turns the suction nozzle 70 on its own axis. The mounting head 24 changes the angle of the electronic component which is held in the suction nozzle 70 using the turning device 78. Note that, the suction nozzle 70 is configured to be attachable and detachable in relation to the mounting head 24, and it is possible to change to a suction nozzle of a different size. It is also possible to change to a bolt head engagement tool (refer to FIG. 2) 79 which will be described later.

Figure 2:
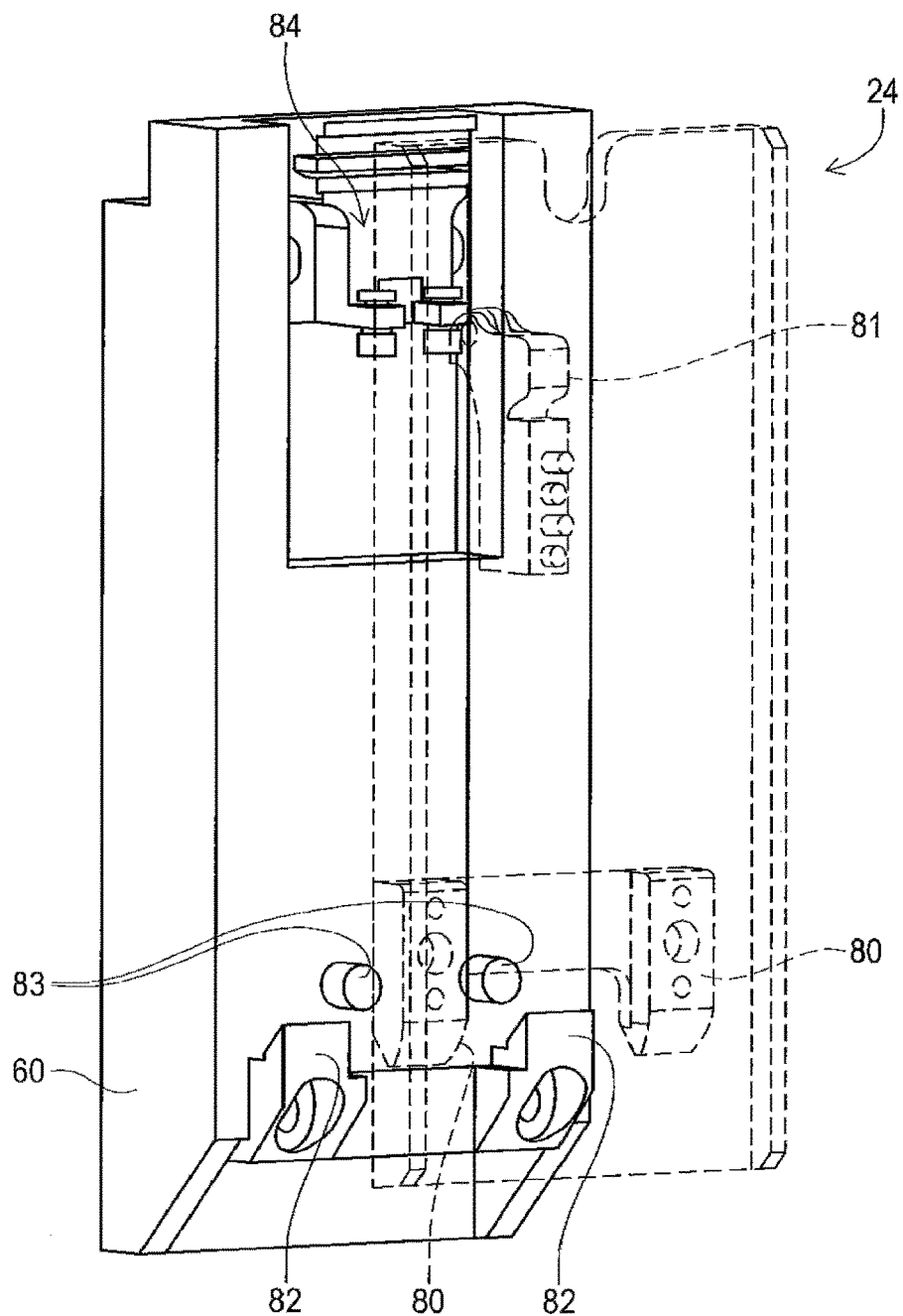
FIG. 2 is a perspective diagram illustrating a mounting head and a Y-axis slider.

The mounting head 24 is configured to be attachable and detachable in relation to the Y-axis slider 60 in a single operation. Specifically, as illustrated in FIG. 2, two leg sections 80 are provided on the bottom portion of the rear surface of the mounting head 24, and an engagement block 81 is provided on the top portion. Meanwhile, two leg section support portions 82 and two engagement rollers 83 are provided on the bottom portion of the Y-axis slider 60, and a lock mechanism 84 is provided on the top portion. The bottom end portion of the leg section 80 is wedge-shaped and engages with the top end portion of the leg section support portion 82, which is V-shaped. Accordingly, the position of the mounting head 24 is defined in the vertical directions. Due to the leg sections 80 being engaged with the leg section support portions 82, the outer circumferential surfaces of the two engagement rollers 83 make contact with the side surfaces of the insides of the two leg sections 80. Accordingly, the position of the mounting head 24 is defined in the horizontal directions. The engagement block 81 is fitted between a pair of rollers of the lock mechanism 84 by pushing the engagement block 81 into the lock mechanism 84 in a state in which the leg sections 80 are engaged with the leg section support portions 82. The pair of rollers is biased by springs in directions causing the rollers to approach each other, and the engagement block 81 is gripped by the pair of rollers in a V groove which is formed in the rear surface side. Accordingly, the mounting head 24 is mounted to the Y-axis slider 60 in a single operation. Note that, by operating a release lever (not illustrated), the pair of rollers of the lock mechanism 84 separate against the elastic force of the springs, and the locking of the engagement block 81 by the lock mechanism 84 is released. Accordingly, the mounting head 24 is removed from the Y-axis slider 60 in a single operation.

The supply device 26 is a feeder-type supply device and includes a plurality of tape feeders 85. The tape feeder 85 contains taped components in a wound state. The taped components are obtained by taping the electronic components. The tape feeder 85 feeds out the taped components using a feed device (refer to FIG. 5) 86. Accordingly, the feeder-type supply device 26 supplies the electronic components to the supply position by feeding out the taped components. Note that, the tape feeder 85 can be attached and detached in relation to the base 54, and it is possible to support the exchanging of the electronic components, shortfalls in the electronic components, and the like.

Figure 3:
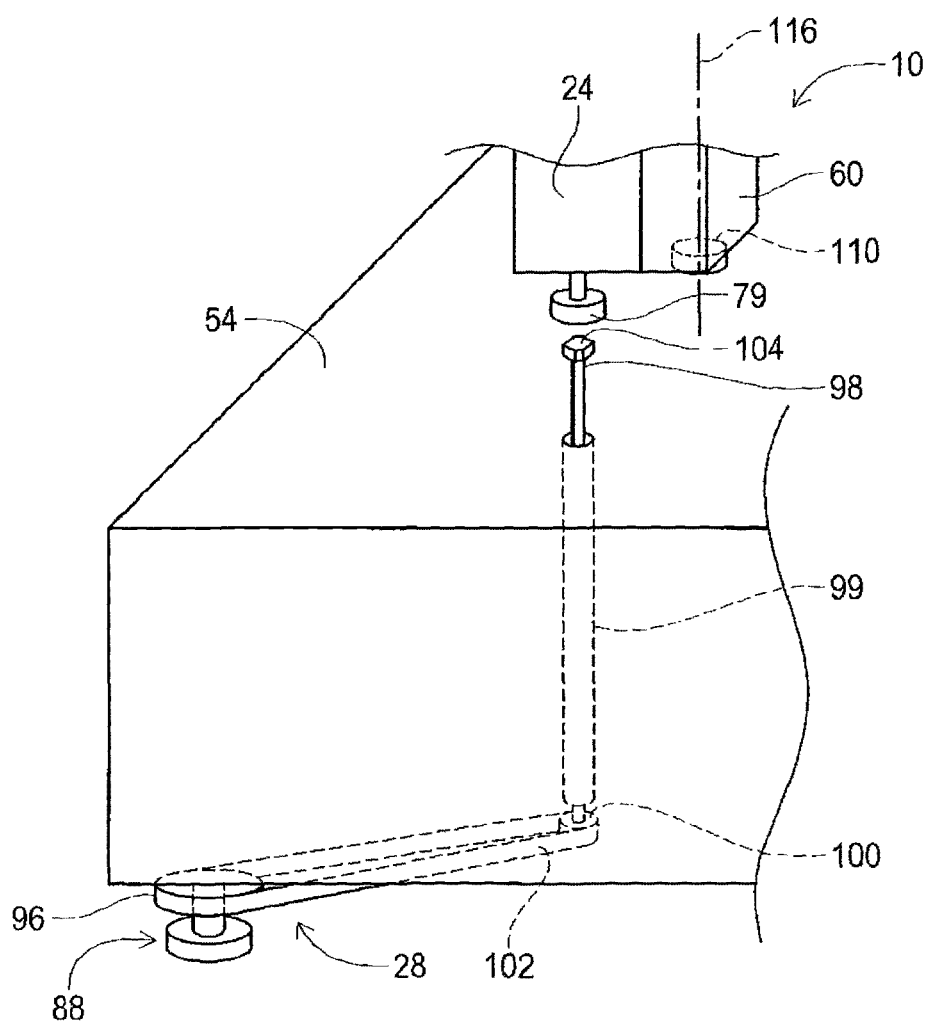
FIG. 3 is a perspective diagram illustrating an adjustment mechanism with which the board working device of FIG. 1 is provided.

The adjustment mechanism 28 is a mechanism for performing the leveling of the board working device 10, that is, a mechanism for adjusting the inclination of the base 54. Specifically, as illustrated in FIG. 3, main legs 88 are provided on the bottom portion of the base 54. The main leg 88 is for supporting the base 54, and one is provided on each corner portion of the bottom portion of the base 54. The main leg 88 is a screw-system support leg, and it is possible to adjust the height by screw adjustment. A first pulley 96 is fixed to the screw portion of the main leg 88.

A rotating shaft 98 is provided in a location closer to the center portion of the base 54 than the first pulley 96. The rotating shaft 98 is inserted through a through hole 99 which is formed in the base 54 to extend in the vertical directions, the bottom end of the rotating shaft 98 extends out from the bottom face of the base 54, and the top end of the rotating shaft 98 extends out from the top face of the base 54. Note that, the top end of the rotating shaft 98 is positioned within the movable range of the mounting head 24, that is, the movement range of the mounting head 24 according to the moving device 22. The rotating shaft 98 is provided to be capable of rotating freely around its axis in the through hole 99. A second pulley 100 which has a smaller diameter than the first pulley 96 is fixed to the bottom end of the rotating shaft 98. A pulley belt 102 is wound around the outer circumferential surface of the first pulley 96 and the outer circumferential surface of the second pulley 100. A bolt head 104 is fixed to the top end of the rotating shaft 98. According to this structure, by rotating the bolt head 104, the screw portion of the main leg 88 is adjusted and the height of the main leg 88 is adjusted.

Figure 4:
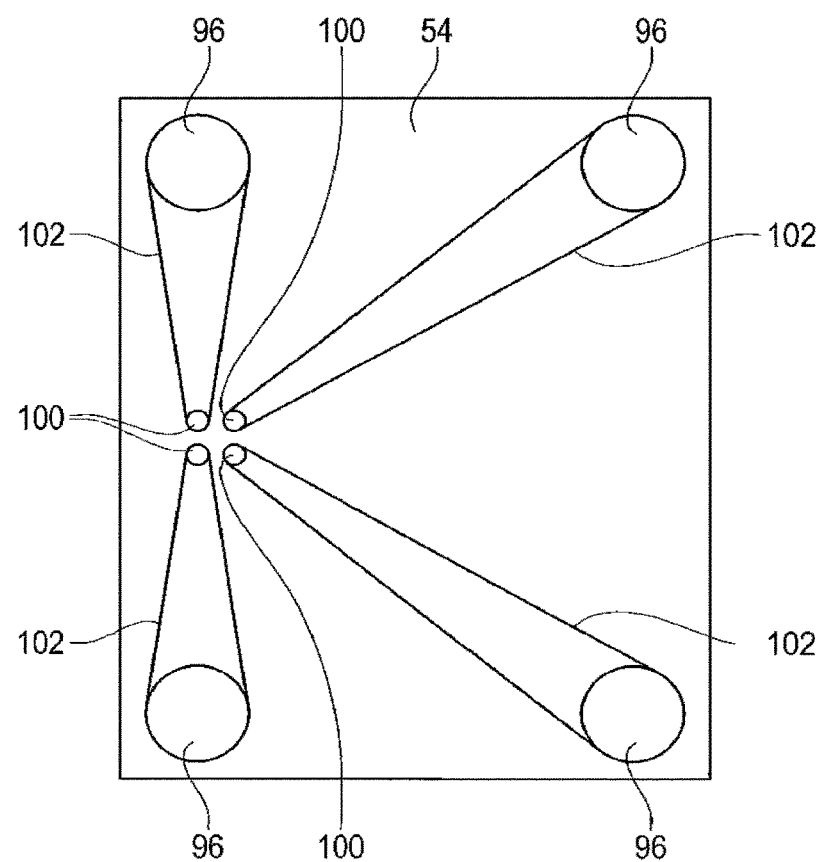
FIG. 4 is a plan view illustrating the adjustment mechanism with which the board working device of FIG. 1 is provided.

The main legs 88 are arranged on four corners of the bottom portion of the base 54. Therefore, the inclination of the base 54 is adjusted by adjusting the height of each of the main legs 88. Accordingly, the leveling of the board working device 10 is performed. Note that, four first pulleys 96 corresponding to the main legs 88 which are arranged on the four corners of the bottom portion of the base 54 position in the four corners of the base portion of the base 54 as illustrated in FIG. 4. Meanwhile, four second pulleys 100 which are linked to the four first pulleys 96 are arranged together in one location of the bottom portion of the base 54. Accordingly, as illustrated in FIG. 1, four bolt heads 104 which are connected to the four second pulleys 100 via the rotating shafts 98 are arranged together in one location on the base 54.

The board working device 10 is provided with a mechanism (not illustrated) for adjusting the leveling of the conveyance device 20, that is, the inclination angle of a circuit board holding surface of the conveyance device 20. The mechanism includes a plurality of full-threaded bolts (not illustrated) which are provided on the corner portions of the bottom surface of the conveyance device 20. One end portion of the full-threaded bolt is threaded right-handed and engages with the bottom surface of the conveyance device 20. Meanwhile, the other end portion of the full-threaded bolt is threaded left-handed and engages with the top surface of the base 54. Accordingly, the distance between the conveyance device 20 and the base 54 is changed by rotating the full-threaded bolt. Therefore, it is possible to perform the leveling of the conveyance device 20 by adjusting the plurality of full-threaded bolts which are provided in the corner portions of the bottom surface of the conveyance device 20.

A pulley (not illustrated) is fixed to the full-threaded bolt, and, in the same manner as the first pulley 96 of the adjustment mechanism 28, the pulley is joined to a rotating shaft (not illustrated) via a pulley belt (not illustrated) and a pulley (not illustrated) on which the pulley belt is wound. A bolt head (refer to FIG. 1) 108 is fixed to the top end of the rotating shaft. According to this structure, by rotating the bolt head 108, the full-threaded bolt is adjusted, and the leveling of the conveyance device 20 is performed.

The board working device 10 is provided with a mark camera (refer to FIGS. 1, 3, and 5) 110, a part camera (refer to FIG. 5) 112, and a nozzle changer (refer to FIG. 1) 114. The mark camera 110 is fixed to the bottom surface of the Y-axis slider 60 in a state of facing downward. In other words, as illustrated in FIG. 3, the mark camera 110 is fixed to the bottom surface of the Y-axis slider 60 in an orientation in which an optical axis line 116 thereof extends in the vertical directions. The mark camera 110 is capable of imaging an arbitrary position of the circuit board which is supported in a predetermined position by the conveyor belts 30 by being moved by the moving device 22. Meanwhile, the part camera 112 is provided on the base 54 in a state of facing upward, and is capable of imaging the electronic component which is held by the mounting head 24. The nozzle changer 114 stores a plurality of plural types of the suction nozzle 70, and it is possible to automatically exchange the suction nozzle 70 which is mounted to the mounting head 24 and the suction nozzles 70 which are stored in the nozzle changer 114. The bolt head engagement tool (refer to FIG. 3) 79 is also stored in the nozzle changer 114, and the nozzle changer 114 is capable of automatically exchanging the suction nozzle 70 which is mounted to the mounting head 24 and the bolt head engagement tools 79 which are stored in the nozzle changer 114. Note that, a recessed portion (not illustrated) with which the bolt head 104 of the adjustment mechanism 28 is capable of engaging is formed in the bottom face of the bolt head engagement tool 79.

Figure 5:
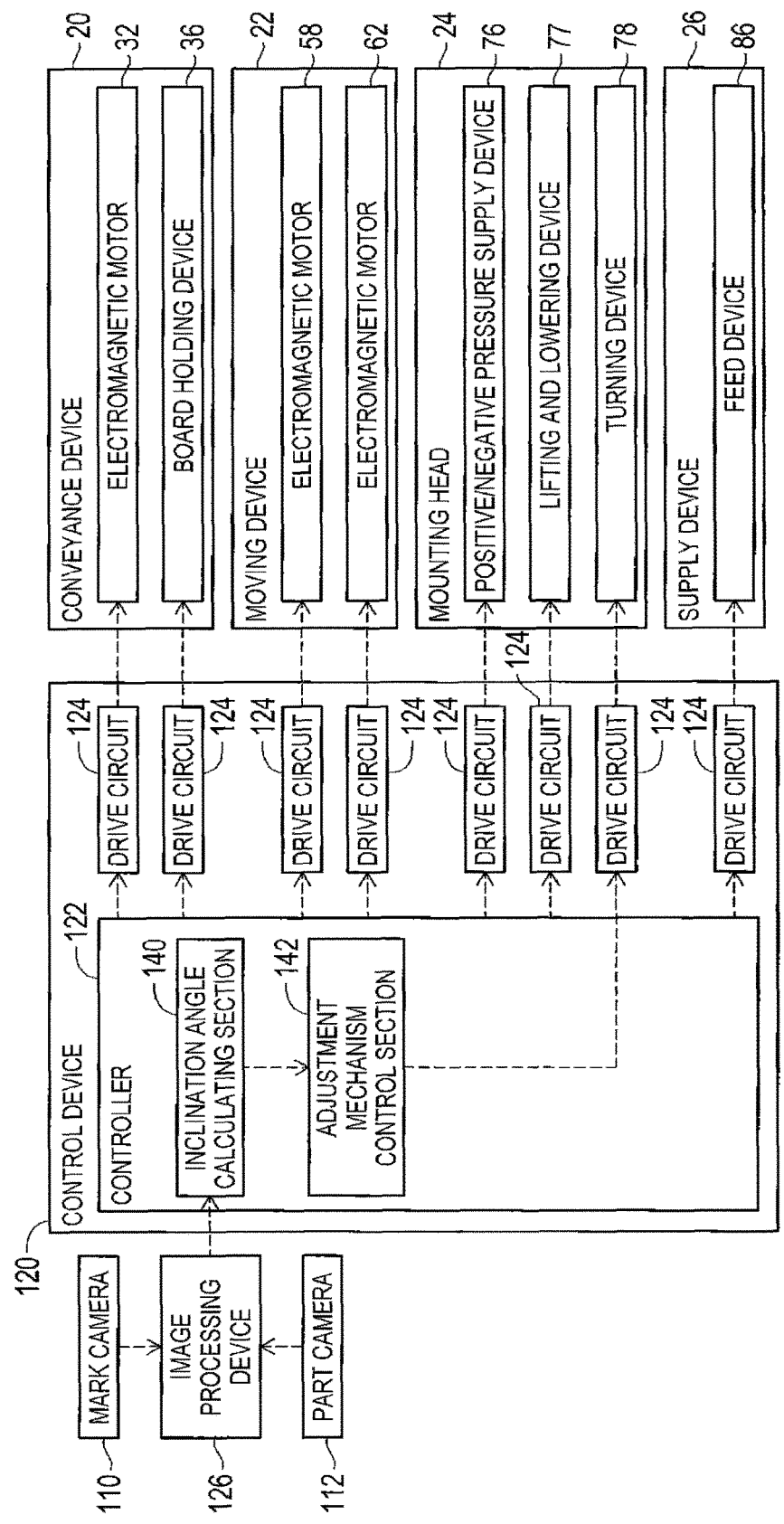
FIG. 5 is a block diagram illustrating a control device with which the board working device is provided.

As illustrated in FIG. 5, the board working device 10 is provided with a control device 120. The control device 120 is provided with a controller 122 and a plurality of drive circuits 124. The plurality of drive circuits 124 are connected to the electromagnetic motor 32, 58, and 62, the board holding device 36, the positive/negative pressure supply device 76, the lifting and lowering device 77, the turning device 78, and the feed device 86. The controller 122 is provided with a CPU, a ROM, a RAM, and the like, the main constituent of the controller 122 is a computer, and the controller 122 is connected to the plurality of drive circuits 124. Accordingly, the operations of the conveyance device 20, the moving device 22, and the like are controlled by the controller 122. The controller 122 is also connected to an image processing device 126. The image processing device 126 processes image data which is obtained by the mark camera 110 and the part camera 112, and the controller 122 acquires various information from the image data.

<Mounting Work by Board Working Device>

According to the configuration which is described above, in the board working device 10, it is possible to perform the mounting work on the circuit board 34 which is held by the conveyance device 20 using the mounting head 24. Specifically, according to the instructions of the controller 122, the circuit board 34 is conveyed to a working position, and at this position, the circuit board 34 is held in a fixed manner by the board holding device 36. Next, the mark camera 110 moves above the circuit board 34 and images the circuit board 34 according to the instructions of the controller 122. Accordingly, the controller 122 acquires information relating to the error of the holding position of the circuit board. The tape feeder 85 feeds out the taped component and supplies the electronic component at the supply position according to the instructions of the controller 122. The mounting head 24 moves above the supply position of the electronic component and sucks and holds the electronic component using the suction nozzle 70 according to the instructions of the controller 122. Subsequently, the mounting head 24 moves above the part camera 112, and the part camera 112 images the electronic component which is sucked and held by the suction nozzle 70 according to the instructions of the controller 122. Accordingly, the controller 122 acquires information relating to the error of the suction position of the electronic component. The mounting head 24 moves above the circuit board 34, the error of the holding position, the error of the suction position and the like of the held electronic component is corrected, and the electronic component is mounted on the circuit board according to the instructions of the controller 122.

<Leveling of Board Working Device and Conveyance Device>

In the board working device 10, the mounting work of the electronic component is performed according to the procedure described above; however, there is demand for mounting work of the electronic component at an extremely high precision. Meanwhile, even after the installation of the board working device 10 to a predetermined position in a workplace, there is a concern that, with the passage of time, the base 54 will warp due to the influence of the weight of structures mounted thereon, mechanical vibration, undulation of the installation surface, and the like. The warping of the base 54 also leads to warping of the conveyance device 20 and each of the slide mechanisms, and the positional relationship of the conveyance device 20 to the mounting head 24 and the mark camera 110 also changes. In other words, this also influences the angular relationship of the circuit board holding surface of the conveyance device 20 to the lifting and lowering axial line of the suction nozzle 70 of the mounting head 24 and the optical axis line of the mark camera 110. Accordingly, the mounting precision of the electronic components of the board working device 10 is degraded. Therefore, after the installation of the board working device 10, confirmation work of the levelness of the base 54 and the positional relationship of the conveyance device 20 to the mounting head 24 and the mark camera 110 is performed each time a predetermined time elapses. Therefore, the leveling of the board working device 10, that is, the adjustment work of the inclination angle of the base 54, the confirmation work of the positional relationship of the conveyance device 20 to the mounting head 24 and the mark camera 110, and the like are extremely important. However, the leveling and the like of the board working device are largely dependent on the proficiency of the worker, and depending on the worker, the work may require a great amount of time. In consideration of such points, in the board working device 10, the leveling of the board working device 10 is performed using the mounting head 24.

Figure 6:
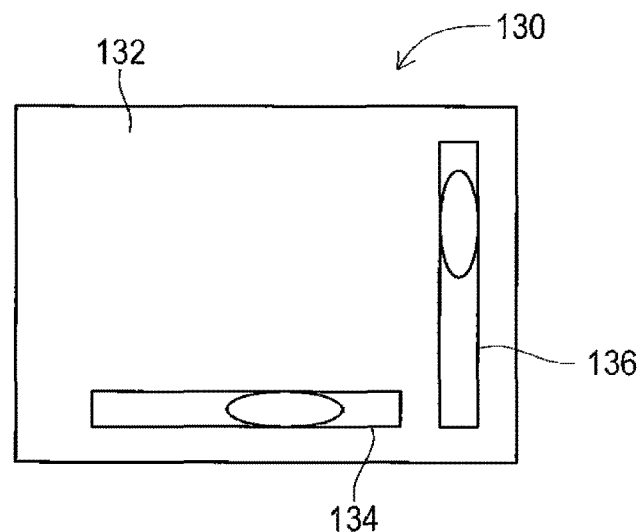
FIG. 6 is a diagram illustrating a conveyance target object in which leveling instruments of the example are embedded.

Specifically, first, the conveyance device 20 is caused to convey a planar embedded leveling instrument plate within which bubble-tube leveling instruments are embedded instead of the circuit board 34. As illustrated in FIG. 6, an embedded leveling instrument plate 130 is formed of a substantially rectangular main body section 132, a first bubble-tube leveling instrument 134 and a second bubble-tube leveling instrument 136, which are embedded in the main body section 132. The first bubble-tube leveling instrument 134 and the second bubble-tube leveling instrument 136 are rod-shaped glass sealed containers, sealed inside which are a liquid such as an alcohol or an ether and a bubble, reference lines (not illustrated) being marked on each of the leveling instruments 134 and 136. The degree of inclination of each of the leveling instruments 134 and 136 in relation to a level plane is estimated according to the positional relationship between the reference lines and the bubble. Note that, the first bubble-tube leveling instrument 134 is arranged to extend in the longitudinal directions of the main body section 132, and the second bubble-tube leveling instrument 136 is arranged to extend in the directions which intersect the first bubble-tube leveling instrument 134 at a right angle.

The worker causes the embedded leveling instrument plate 130 to be conveyed by the conveyance device 20 in an orientation in which the longitudinal directions of the embedded leveling instrument plate 130 match the X-axis directions. According to the instructions of the controller 122, the embedded leveling instrument plate 130 is conveyed to the working position, and at this position, is held in a fixed manner by the board holding device 36. Next, the mark camera 110 moves above the embedded leveling instrument plate 130 and images the embedded leveling instrument plate 130 according to the instructions of the controller 122. Accordingly, the controller 122 acquires information relating to the reference lines in the first bubble-tube leveling instrument 134 and the second bubble-tube leveling instrument 136 to the bubbles, and calculates the inclination angle of the embedded leveling instrument plate 130 in relation to a level plane. Specifically, the inclination angle of the embedded leveling instrument plate 130 in the X-axis directions in relation to a level plane is calculated based on the positional relationship between the reference lines on the first bubble-tube leveling instrument 134 and the bubble, and the inclination angle of the embedded leveling instrument plate 130 in the Y-axis directions in relation to a level plane is calculated based on the positional relationship between the reference lines on the second bubble-tube leveling instrument 136 and the bubble. The inclination angle of the embedded leveling instrument plate 130 in relation to a level plane is calculated based on the inclination angles of the embedded leveling instrument plate 130 in the X-axis directions and the Y-axis directions in relation to a level plane. When the inclination angles of the embedded leveling instrument plate 130 are calculated, the adjustment amount of the height of each of the main legs 88, that is, the rotation amounts of the bolt heads 104 are calculated based on the inclination angles.

When the rotation amounts of the bolt heads 104 are calculated, the leveling is performed using the mounting head 24. However, before the leveling is performed using the mounting head 24, the bolt head engagement tool 79 is mounted to the mounting head 24 instead of the suction nozzle 70. Specifically, the mounting head 24 moves above the nozzle changer 114 and moves the suction nozzle 70 downward according to the instructions of the controller 122. Subsequently, the mounting head 24 releases the suction nozzle 70 in a predetermined vacant position of the nozzle changer 114 and mounts the bolt head engagement tool 79 in place of the suction nozzle 70 according to the instructions of the controller 122.

The mounting head 24 to which the bolt head engagement tool 79 is mounted moves above the bolt head 104 of the adjustment mechanism 28 and moves the bolt head engagement tool 79 downward according to the instructions of the controller 122. Accordingly, the bolt head engagement tool 79 is engaged with the bolt head 104. The mounting head 24 operates the turning device 78 and rotates the bolt head 104 based on the calculated rotation amount of the bolt head 104 according to the instructions of the controller 122. This series of work tasks is performed on the bolt heads 104 of the adjustment mechanisms 28 corresponding to all of the main legs 88 to complete the leveling of the board working device 10. In other words, it is possible to adjust the inclination angles of the circuit board holding surface of the conveyance device 20, that is, the heights can be adjusted to arbitrary heights.

It is possible to adjust the inclination angles of the conveyance device 20 in relation to the base 54 by adjusting the rotation amounts of the bolt heads 108 instead of the bolt heads 104 using the mounting head 24 to which the bolt head engagement tool 79 is mounted. By adjusting the inclination angles of the conveyance device 20 in relation to the base 54, it is possible to adjust the positional relationship of the circuit board holding surface of the conveyance device 20 to the lifting and lowering axial line of the suction nozzle 70 of the mounting head 24 and the optical axis line of the mark camera 110, for example, to render the circuit board holding surface perpendicular to the lifting and lowering axial line and the optical axis line. Note that, since the calculation of the rotation amount of the bolt head 108 and the adjustment of the bolt head 108 using the bolt head engagement tool 79 are the same as with the bolt head 104 described above, description thereof will be omitted.

Note that, as illustrated in FIG. 4, the controller 122 includes an inclination angle calculating section 140 and an adjustment mechanism control section 142 as functional units for performing the leveling using the mounting head 24. The inclination angle calculating section 140 is a functional unit for calculating the inclination angles of the embedded leveling instrument plate 130 based on the imaging data of each of the leveling instruments 134 and 136. The adjustment mechanism control section 142 is a functional unit for controlling the operation of the mounting head 24 and rotating the bolt heads 104 and the like of the adjustment mechanisms 28 based on the calculated inclination angles of the embedded leveling instrument plate 130.

In this manner, in the board working device 10, by performing the leveling using the mounting head 24, it is possible to appropriately and swiftly perform the leveling of the board working device 10 and the conveyance device 20 regardless of the proficiency of the individual worker. In the board working device 10, the rotation of the bolt heads 104 and 108 is performed using the mounting head 24 which includes the turning device 78. Accordingly, by simply mounting the bolt head engagement tool 79 to the mounting head 24 instead of the suction nozzle 70, it is possible to rotate the bolt heads 104, there is no need to specifically provide a dedicated device for rotating the bolt heads 104 and 108, and this is economical.

In the board working device 10, the embedded leveling instrument plate 130 is conveyed by the conveyance device 20, and the leveling of the board working device 10 and the like is performed using each of the leveling instruments 134 and 136 of the embedded leveling instrument plate 130 which is fixed onto the conveyance device 20. In a board working device of the related art, ordinarily, the leveling instrument is arranged on the base and it is necessary to secure the space for arranging the leveling instrument on the base. Therefore, there is a concern that the arrangement space of the leveling instruments will impede efforts to render the device more compact. However, in the board working device 10, it is not necessary to provide the leveling instruments on the base 54, and it is possible to render the device more compact.

Incidentally, in the example, the board working device is an example of a manufacturing work machine. The conveyance device 20 is an example of a conveyance device. The moving device 22 is an example of a moving device. The mounting head 24 is an example of an adjustment section operation device. The adjustment mechanism 28 is an example of an adjustment mechanism. The circuit board 34 is an example of a conveyance target object. The base 54 is an example of a base and an adjustment target body. The bolt head 104 and the bolt head 108 are an example of an adjustment section. The mark camera 110 is an example of an imaging device. The control device 120 is an example of a control device. The first bubble-tube leveling instrument 134 and the second bubble-tube leveling instrument 136 are an example of an inclination checker.

Figure 7:
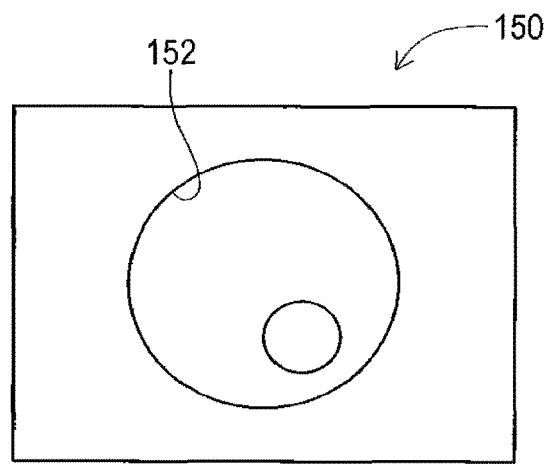
FIG. 7 is a diagram illustrating a conveyance target object in which a leveling instrument of a modification example is embedded.

Note that, the present disclosure is not limited to the example described above, and it is possible to carry out the present disclosure in various modes subjected to various modifications and improvements based on the knowledge of a person skilled in the art. Specifically, for example, in the example described above, the leveling of the board working device 10 is performed using the embedded leveling instrument plate 130; however, it is possible to perform the leveling of the board working device 10 using an element with various shapes of leveling instrument embedded therein. Specifically, for example, it is possible to perform the leveling of the board working device 10 using an embedded leveling instrument plate 150 in which a leveling instrument of the shape illustrated in FIG. 7 is embedded. A disc-shaped glass sealed container 152 is embedded in the inner portion of the embedded leveling instrument plate 150, and a liquid such as an alcohol or an ether and a bubble are sealed in the disc-shaped glass sealed container 152. If this embedded leveling instrument plate 150 is used, it is possible to calculate the inclination angles of the embedded leveling instrument plate 150 with only one leveling instrument.

In the example described above, by adjusting the heights of the main legs 88, the leveling of the board working device 10 is performed; however, when the board working device 10 is provided with a mechanism capable of directly adjusting the inclination of the base 54, it is possible to perform the leveling using the adjustment of the mechanism.

In the example described above, the heights of the main legs 88 are adjusted so as to render the base 54 level; however, it is possible to adjust the heights of the main legs 88 such that the inclination angles of the base 54 become predetermined inclination angles. For example, it is possible to perform the height adjustment of the main legs 88 such that the circuit board holding surface of the conveyance device 20 is perpendicular to the lifting and lowering axial line of the suction nozzle 70 of the mounting head 24 or the optical axis line of the mark camera 110.

Even if the embedded leveling instrument plate 130 or 150 in which the leveling instrument is embedded is not used, it is possible to perform the leveling of the board working device 10 using a general leveling instrument which is mounted on the circuit board 34 or the like. Specifically, a general leveling instrument is mounted on a jig board or the like having rigidity with which it is possible to convey the conveyance device 20, and the leveling instrument is imaged using the mark camera 110. The inclination angles of the circuit board 34 are calculated based on imaging data thereof, and it is possible to perform the leveling of the board working device 10 based on the calculated inclination angles of the circuit board 34.

In the example described above, the heights of the main legs 88 are adjusted using the mounting head 24; however, it is possible to provide a dedicated device for adjusting the heights of the main legs 88. In other words, it is possible to mount a dedicated device for rotating the bolt heads 104 to the Y-axis slider 60.

In the example described above, the bolt heads 104 and 108 are rotated using the mounting head 24; however, it is possible to adopt a dedicated work head for rotating the bolt heads 104 and 108. Specifically, it is possible to provide a rotation device with high rotational torque on the work head and rotate the bolt heads 104 and 108 using the rotation device with the high rotational torque.

In the example described above, the technology of the present disclosure is applied to the board working device 10 for executing the mounting work; however, it is possible to apply the technology of the present disclosure to a device for executing various work on a circuit board. Specifically, for example, it is possible to apply the technology of the present disclosure to a device for applying cream solder or the like to a circuit board, a device for ejecting an adhesive or the like onto a circuit board, a device for subjecting a circuit board to various processes, or the like. The technology of the present disclosure is not limited to a device which performs work on a circuit board, and it is possible to apply the technology of the present disclosure to various work machines which are used in manufacturing work.

REFERENCE SIGNS LIST

10: board working device (manufacturing work machine), 20: conveyance device, 22: moving device, 24: mounting head (adjustment section operation device), 28: adjustment mechanism, 34: circuit board (conveyance target object), 54: base (adjustment target body), 88: main leg (leg section), 104: bolt head (adjustment section), 110: mark camera (imaging device), 120: control device, 134: first bubble-tube leveling instrument (inclination checker), 136: second bubble-tube leveling instrument (inclination checker)
FIG. 1
Y-AXIS DIRECTION
X-AXIS DIRECTION
FIG. 5
110: MARK CAMERA
126: IMAGE PROCESSING DEVICE
112: PART CAMERA
120: CONTROL DEVICE
122: CONTROLLER
140: INCLINATION ANGLE CALCULATING SECTION
142: ADJUSTMENT MECHANISM CONTROL SECTION
124: DRIVE CIRCUIT
20: CONVEYANCE DEVICE
32: ELECTROMAGNETIC MOTOR
36: BOARD HOLDING DEVICE
22: MOVING DEVICE
58: ELECTROMAGNETIC MOTOR
62: ELECTROMAGNETIC MOTOR
24: MOUNTING HEAD
76: POSITIVE/NEGATIVE PRESSURE SUPPLY DEVICE
77: LIFTING AND LOWERING DEVICE
78: TURNING DEVICE
26: SUPPLY DEVICE
86: FEED DEVICE

The invention claimed is:

1. A manufacturing work machine provided with an adjustment mechanism including an adjustment section for adjusting an inclination of an adjustment target body which is one of a base and a conveyance device which is arranged on the base, the manufacturing work machine comprising:
    an adjustment section operation device which adjusts the inclination of the adjustment target body by operating the adjustment section;
    a moving device which moves the adjustment section operation device to an arbitrary position above the base;
    a control device which controls operations of the adjustment section operation device;
    an inclination checker for confirming the inclination of the adjustment target body; and
    an imaging device capable of imaging the inclination checker,
    wherein the adjustment section is arranged within a movement range of the adjustment section operation device according to the moving device, and
    wherein the control device controls the operations of the adjustment section operation device based on imaging data of the inclination checker which is imaged by the imaging device.

2. The manufacturing work machine according to claim 1, further comprising:
    the conveyance device for conveying a conveyance target object,
    wherein the inclination checker is conveyed together with the conveyance target object by the conveyance device,
    wherein the imaging device images the inclination checker which is conveyed by the conveyance device together with the conveyance target object, and
    wherein the control device controls the operations of the adjustment section operation device based on the imaging data of the inclination checker which is imaged by the imaging device.

3. The manufacturing work machine according to claim 2, wherein the inclination checker is embedded in the conveyance target object which is conveyed by the conveyance device.

4. A manufacturing work machine provided with an adjustment mechanism including an adjustment section for adjusting an inclination of an adjustment target body which is one of a base and a conveyance device which is arranged on the base, the manufacturing work machine comprising:
    an adjustment section operation device which adjusts the inclination of the adjustment target body by operating the adjustment section; and
    a moving device which moves the adjustment section operation device to an arbitrary position above the base, wherein
    the adjustment section is arranged within a movement range of the adjustment section operation device according to the moving device,
    the adjustment mechanism includes a leg that supports the base, and
    the adjustment section is a bolt head that adjusts a height adjustment portion of the leg to change a height of a portion of the base.

5. The manufacturing work machine according to claim 4, wherein the bolt head is connected to the leg by a pulley belt supported by a pair of pulleys.

6. A manufacturing work machine provided with an adjustment mechanism including an adjustment section for adjusting an inclination of an adjustment target body which is one of a base and a conveyance device which is arranged on the base, the manufacturing work machine comprising:
   an adjustment section operation device which adjusts the inclination of the adjustment target body by operating the adjustment section; and
   a moving device which moves the adjustment section operation device to an arbitrary position above the base, wherein
   the adjustment section is arranged within a movement range of the adjustment section operation device according to the moving device, and
   the adjustment section operation device is a mounting head that detachably attaches a suction nozzle to mount components and detachably attaches a bolt head engagement tool that rotates the bolt head to adjust the height adjustment portion of the leg.

* * * * *